(12) United States Patent
Chen et al.

(10) Patent No.: US 8,738,956 B2
(45) Date of Patent: May 27, 2014

(54) METHOD AND APPARATUS FOR UPDATING A FRACTIONAL TIME INTERVAL USING TIME-DOMAIN INTERPOLATORS IN OPTICAL COMMUNICATIONS

(75) Inventors: Yuanjie Chen, Saratoga, CA (US); Chuandong Li, Ottawa (CA); Zhuhong Zhang, Ottawa (CA); Fei Zhu, San Jose, CA (US); Yu Sheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 607 days.

(21) Appl. No.: 13/096,196

(22) Filed: Apr. 28, 2011

(65) Prior Publication Data

US 2012/0274364 A1 Nov. 1, 2012

(51) Int. Cl.
*G06F 1/00* (2006.01)
(52) U.S. Cl.
USPC .......................................... 713/500; 713/503
(58) Field of Classification Search
USPC .................... 713/500, 503; 375/222
See application file for complete search history.

(56) References Cited

U.S. PATENT DOCUMENTS

| | | | |
|---|---|---|---|
| 6,370,188 B1 * | 4/2002 | Wu et al. | 375/222 |
| 7,482,953 B2 * | 1/2009 | Aerts et al. | 341/61 |
| 7,532,822 B2 | 5/2009 | Sun et al. | |
| 8,103,469 B1 * | 1/2012 | Wong et al. | 702/66 |
| 2004/0254969 A1 * | 12/2004 | Pisoni | 708/404 |
| 2009/0185695 A1 * | 7/2009 | Marton et al. | 381/66 |
| 2012/0213531 A1 * | 8/2012 | Nazarathy et al. | 398/202 |
| 2013/0287410 A1 * | 10/2013 | Leven et al. | 398/208 |

OTHER PUBLICATIONS

Gardner, F. "Interpolation in Digital Modems—Part 1: Fundamentals," IEEE Transactions on Communications, vol. 41, No. 3, Mar. 1993, pp. 501-507.
Erup, L. et al., . "Interpolation in Digital Modems—Part 2: Implementation and Performance," IEEE Transactions on Communications, vol. 41, No. 6, Jun. 1993, pp. 998-1008.
Kuschnerov, et al., "Digital Timing Recovery for Coherent Fiber Optic Systems," JThA63.pdf, OFC/NFOEC 2008, 3 pages.

* cited by examiner

*Primary Examiner* — Chun Cao
(74) *Attorney, Agent, or Firm* — Conley Rose, P.C.; Grant Rodolph; Jonathan K. Polk (57) ABSTRACT

An apparatus comprising an analog-to-digital converter (ADC); a frequency-domain equalizer (FDEQ); a time-domain interpolator positioned between the ADC and the FDEQ, wherein the time domain interpolator is coupled to the ADC and the FDEQ and configured to perform a time-domain interpolation to compensate a signal sample for a plurality of ADC induced changes.

20 Claims, 11 Drawing Sheets

METHOD AND APPARATUS FOR UPDATING A FRACTIONAL TIME INTERVAL USING TIME-DOMAIN INTERPOLATORS IN OPTICAL COMMUNICATIONS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Typical optical receivers comprise a plurality of analog-to-digital converters (ADCs) that may introduce a variety of undesired changes to a digital sample, such as sampling time errors and/or phase skews between the ADCs. Clock recovery methods may be used to remedy the undesired effects, such as using direct adjustment of the ADC clock or other methods in the digital domain, such as time-domain interpolation on the signal samples. Since ADCs may be designed by a variety of manufacturers, a clock recovery method that involves adjusting the ADC clock directly may be difficult to implement.

SUMMARY

In one embodiment, the disclosure includes an apparatus comprising an analog-to-digital converter (ADC); a frequency-domain equalizer (FDEQ); a time-domain interpolator positioned between the ADC and the FDEQ, wherein the time domain interpolator is coupled to the ADC and the FDEQ and configured to perform a time-domain interpolation to compensate a signal sample for a plurality of ADC induced changes.

In another embodiment, the disclosure includes a network component comprising a time-domain interpolator coupled to outputs of at least two analog-to-digital converters (ADCs) and configured to at least one of adjust sampling time, compensate a phase skew between the at least two ADCs, and change at least one sampling rate; and a Fast Fourier Transform (FFT) block coupled to the time-domain interpolator and configured to process the signal sample.

In a third aspect, the disclosure includes a method comprising retrieving a previously computed fractional time interval for a previous time sample from a data store; and computing an updated fractional time interval based on the previously computed fractional time interval, a nominal phase increment associated with a data rate, and a measured timing recovery error.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A clock recovery method in the digital domain may comprise a time-domain interpolation performed on the signal samples. Time-domain interpolation has been previously introduced, e.g., by F. Gardner in "Interpolation in Digital Modems—Part I: Fundamentals", in the Institute of Electrical and Electronics Engineers (IEEE) Transactions On Communications, Vol. 41, No. 3, March 1993, and F. Gardner et. al, "Interpolation in Digital Modems—Part II: Implementation and Performance", IEEE Transactions On Communications, Vol. 41, No. 6, June 1993, both of which are incorporated herein by reference. Using time-domain interpolation allows for time recovery operations, such as sampling time adjustment to compensate for sampling time errors and/or ADC phase skew compensation to adjust phase misalignments, without having to control the operation of the ADC.

In typical implementations of time-domain interpolation for clock recovery, the time-domain interpolator may be placed after the FDEQ. However, the filtering effect of the FDEQ on the phase misalignments may introduce complex functional dependencies between the samples. Further, in a product designed to support applications with different data rates, placing the time-domain interpolator after the FDEQ may require using differently sized Fast Fourier Transforms (FFT) components, which may increase hardware consumption and cost.

Disclosed herein are systems and methods for clock recovery in the digital domain using time-domain interpolation. Time-domain interpolation may be accomplished by a time-domain interpolator placed immediately after the ADC, e.g., before the FDEQ. This architecture may avoid the filtering effect of the FDEQ on the samples and may yield better clock recovery performance. The time-domain interpolator may accomplish sampling time adjustment, ADC phase skew compensation, and/or sampling rate change, which may reduce design complexity. Further, in a product designed to support applications with different data rates, this architecture may allow using same-sized FFTs for all data rates, which may save hardware and cost.

Figure 1:
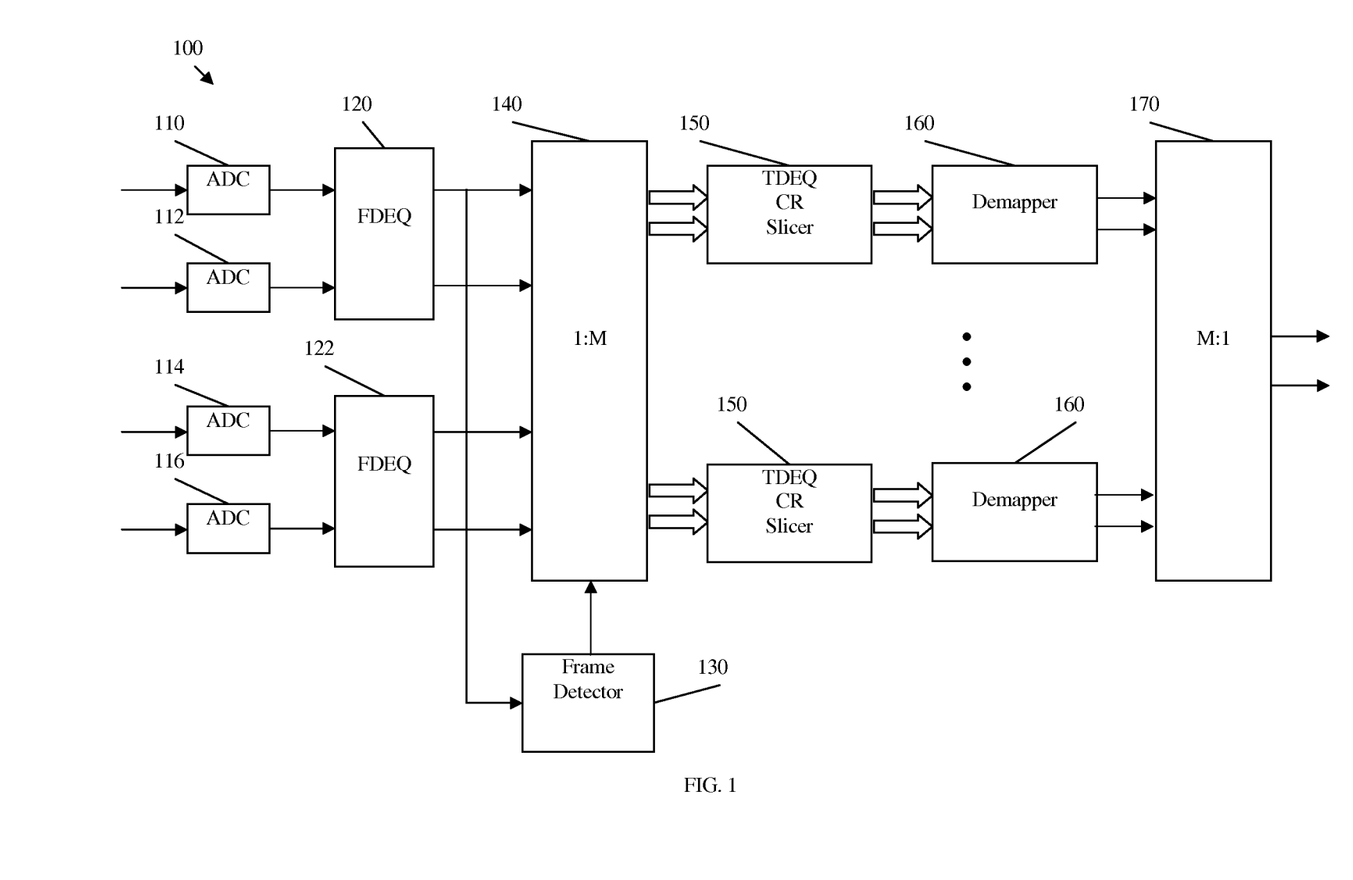
FIG. 1 is a schematic diagram of an embodiment of an optical receiver.

FIG. 1 illustrates a diagram of an embodiment of an optical receiver 100, which may be used in optical communication systems or networks. The optical receiver 100 may comprise a plurality of ADCs 110, 112, 114, 116, a first FDEQ 120 and a second FDEQ 122, a frame detector 130, a demultiplexer 140, at least one time-domain equalizer (TDEQ) 150, at least one demapper 160 that corresponds to the TDEQ 150, and a multiplexer 170. The components of the optical receiver 100 may be arranged as shown in FIG. 1. Specifically, each of the first FDEQ 120 and the second FDEQ 122 may be coupled to some of the ADCs 110, 112, 114, 116 and to the demultiplexer 140. For example, the first FDEQ 120 may be coupled to the ADCs 110, 122, and the second FDEQ may be coupled to the ADCs 114, 116. Additionally, the frame detector 130 may be coupled to the first FDEQ 120, the second FDEQ 122, and the demultiplexer 140, as shown in FIG. 1. Each TDEQ 150 may be coupled to the demultiplexer 140 and to a corresponding demapper 160, which may be coupled to the multiplexer 170. In other embodiments, the optical receiver 100 may comprise different quantities of components than shown in FIG. 1.

The optical receiver 100 may be any device that is configured to receive a first polarized signal and a second polarized signal, which may be orthogonally polarized. For example, the first signal may be an x-polarized signal and the second signal may be a y-polarized signal. Each polarized signal may comprise a quadrature (Q) component and an in-phase (I) component. Each component of the polarized signals may be received at one of the ADCs 110, 112, 114, 116. For example, the ADC 110 may receive the I component of the first polarized signal, the ADC 112 may receive the Q component of the first polarized signal, the ADC 114 may receive the I component of the second polarized signal, and the ADC 116 may receive the Q component of the second signal. The ADCs 110, 112, 114, 116 may convert the received signals from an analog to a digital signal format.

The first FDEQ 120 and second FDEQ 122 may be any device that is configured to receive the signal components from the ADCs 110, 112, 114, 116 and perform signal conditioning, e.g., to compensate for chromatic dispersion or other signal distortions in the signal components. The first FDEQ 120 and the second FDEQ 122 may then send the signal components to the frame detector 130 and/or the demultiplexer 140. The demultiplexer 140 may be any device that is configured to split the received signal into multiple processors. Splitting the received signal into multiple processors may reduce the required processing rate at the TDEQ 150. The number of processors may determine the processing rate at each TDEQ 150. The optical receiver 100 may comprise any number of TDEQs 150 to achieve a desired processing rate at the TDEQs 150. For example, if the optical receiver 100 comprises about two TDEQs 150, the processing rate at the first FDEQ 120 and the second FDEQ 122 may be reduced by about a factor of two at each of the TDEQs 150. The frame detector 130 may be any device that is configured to control the demultiplexer 140, and thus determine the output of the demultiplexer 140. The frame detector 130 may use various techniques to detect the frames, e.g., based on input from the first FDEQ 120 and the second FDEQ 122.

The TDEQ 150 may be any device that is configured to receive frames from the output of the demultiplexer 140 and process the frames using a finite impulse response (FIR) filter. The FIR tap weights may be adjusted to separate the frames of the different polarized signals received from the demultiplexer 140. The tap weights may be varied to adapt to a level of inter-symbol interference (ISI) in the optical signals. For instance, the TDEQ 150 may be an adaptive multi-input multi-output (MIMO) TDEQ coupled to a carrier recovery (CR) loop and a slicer. The CR loop may be configured to compensate for any frequency and/or phase differences between the received signals and a local oscillator, which may improve signal demodulation. The slicer may make a decision, e.g., based upon a magnitude of a received signal in a given time frame, as to whether the value of the signal is a digital high or a digital low value.

The demapper 160 may be any device that is configured to receive the signal (e.g., frames) from the output of the TDEQ 150 and convert the received signal into a bit sequence, which may then be sent to the multiplexer 170. The multiplexer 170 may be any device that is configured to combine the bit sequences, e.g., from the plurality of TDEQs 150 and demappers 160, to provide about two output bit streams that correspond to the two optical signals received at the ADCs 110, 112, 114, 116.

To facilitate the processing of the received signals, the following three conditions on ADC sampling may be desired: (1) sampling at ADCs 110, 112, 114, 116 is synchronous to the transmitted data; (2) the sampling rate at each of the ADCs 110, 112, 114, 116 is an integer multiple of transmitted baud rate 1/T, and (3) the sampling phases of all four ADCs 110, 112, 114, 116 are aligned. Examples of a samples rate, $f_s$, fulfilling condition (2) may be $f_s=1/T$ for T-spaced processing, $f_s=1/2T$ for T/2-spaced processing, etc. Clock recovery methods may comprise a plurality of operations to meet conditions (1)-(3). When condition (1) is not met, ADC sampling may be adjusted using timing recovery. A sampling rate change may have to be performed to meet condition (2), and phase skews between four ADCs may need to be compensated to meeting condition (3).

Figure 2:
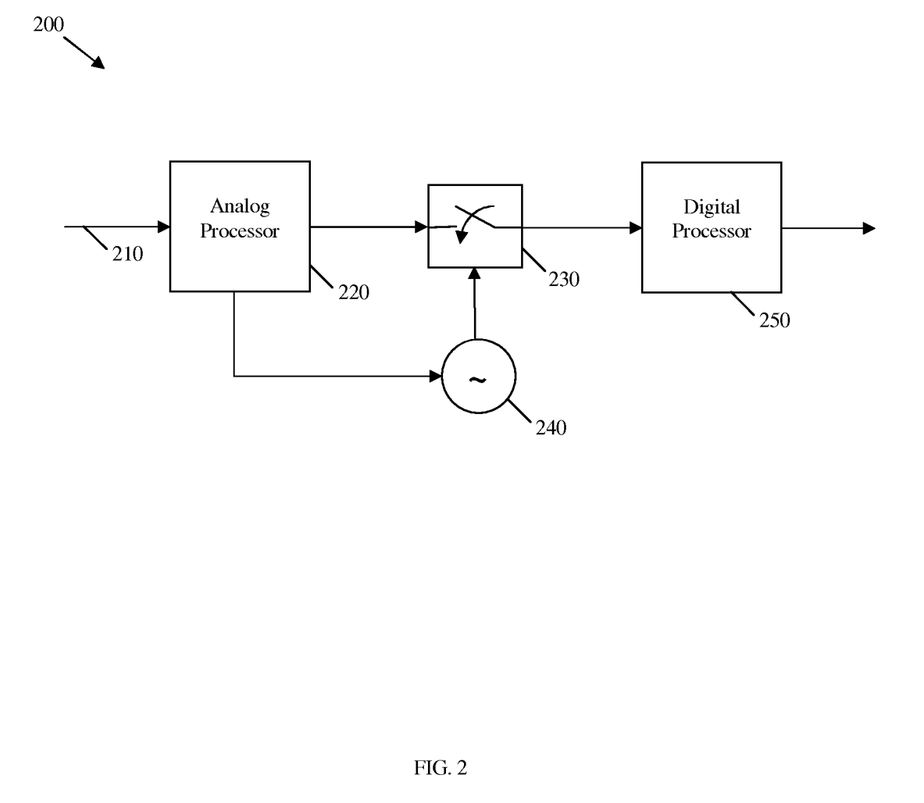
FIG. 2 is a schematic diagram of an embodiment of an analog clock recovery scheme.

FIG. 2 illustrates an embodiment of an analog clock recovery scheme 200. In the analog clock recovery scheme 200, an analog processor 220 may be configured to process a plurality of input samples 210 and then forward the input samples 210a via an ADC sampler 230 for further processing at a digital processor 250. In the analog clock recovery scheme 200, the analog processor 220 may be configured to send a plurality of clock recovery parameters to an ADC sampling clock 240, which may be configured appropriately to implement a clock recovery function.

Figure 3:
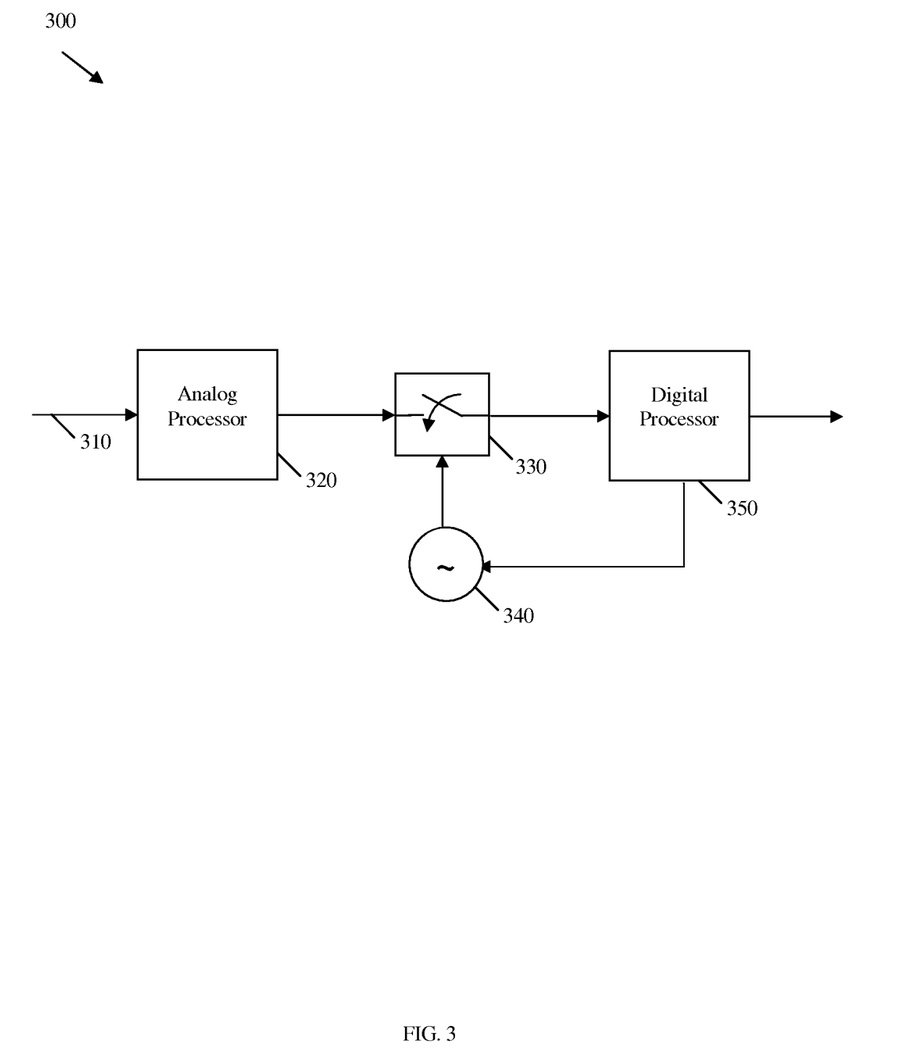
FIG. 3 is a schematic diagram of an embodiment of a hybrid clock recovery scheme.

FIG. 3 illustrates an embodiment of a hybrid clock recovery scheme 300. The hybrid clock recovery scheme 300 may use an analog processor 320 configured to process a plurality of input samples 310, an ADC sampler 330, a digital processor 350, and an ADC sampling clock 340, which may be configured substantially similar to the corresponding components of the analog clock recovery scheme 200. However, in the hybrid clock recovery scheme 300, the digital processor 350 may compute and/or update a plurality of clock recovery parameters that may then be sent to the ADC sampling clock 340. The hybrid clock recovery scheme 300 may implement a clock recovery method, such as described in H. Sun et. al, "Clock Recovery From An Optical Signal with Polarization Impairments", U.S. Pat. No. 7,532,822 B2, which is incorporated herein by reference.

Figure 4:
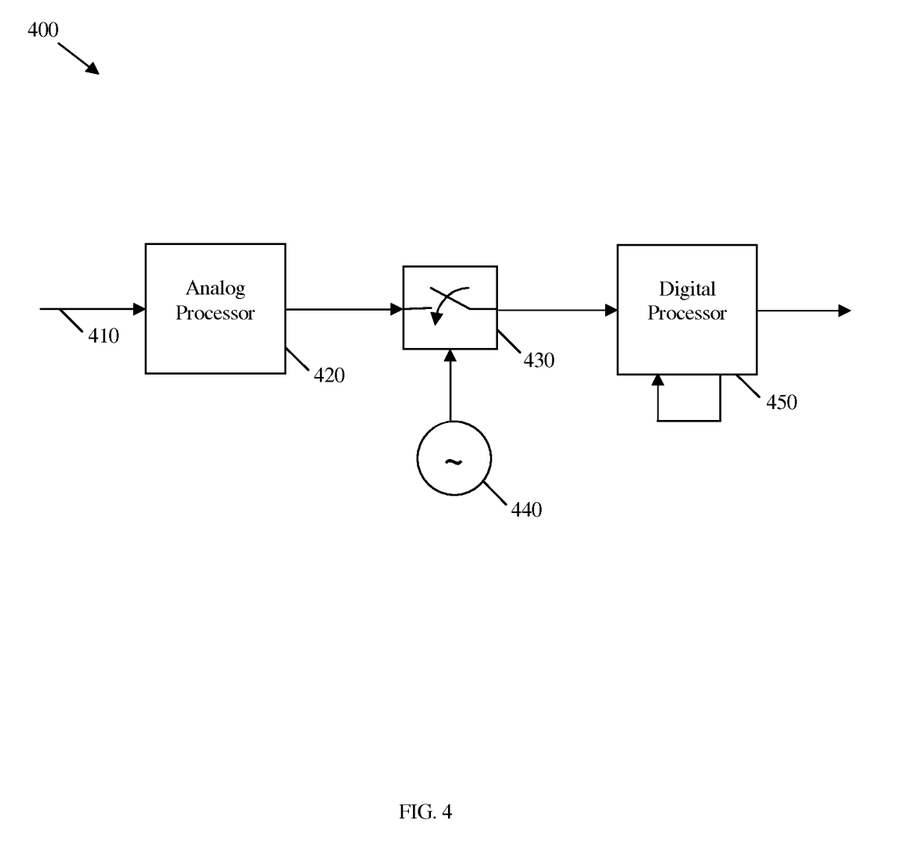
FIG. 4 is a schematic diagram of an embodiment of a digital clock recovery scheme.

FIG. 4 is a schematic diagram of an embodiment of a digital clock recovery scheme 400. The digital clock recovery scheme 400 may use an analog processor 420 configured to process a plurality of input samples 410, an ADC sampler 430, a digital processor 450, and an ADC sampling clock 440, which may be configured substantially similar to the corresponding components of the analog clock recovery scheme 200. The digital clock recovery scheme 400 may implement a clock recovery method that operates in the digital domain without feeding clock recovery parameters into the ADC sampling clock 440. Performing clock recovery in the time domain may be advantageous since it may allow the ADCs 110, 112, 114, 116 to run at their nominal frequency. In typical digital clock recovery methods, a time-domain interpolator may be placed before FDEQ. Typically, a set of one or more time-domain interpolators may be positioned between a plurality of corresponding ADCs and FDEQs in a receiver.

In an embodiment, a k-th interpolator from the set of interpolators used in the receiver may implement a piecewise polynomial function characterized by a time-varying fractional interval $t_k(n)$ at sample n, where k and n are integer numbers. The values of the integer k may range from about one to the total number of ADCs used in the receiver. For example, the value of k may range from about one to about four. The time-varying fractional time interval may be measured in units of input samples, and may be computed by the k-th interpolator according to equation (1) below:

$$t_k(n)=[t_k(n-1)+\Delta t_k+dt_k(n)] \bmod 1 \qquad (1)$$

Each time-varying fractional interval may be associated with three parameters: a k-th initial phase, $t_k(0)$, a k-th nominal phase increment per output sample, $\Delta t_k$, and a k-th varying increment at sample n, $dt_k(n)$. The function mod in equation (1) indicates a modulus function.

The initial phase $t_k(0)$ may be used to compensate for the phase skew between the ADCs. The nominal phase increments $\Delta t_k$ may be identical for all k values, and changing the sampling rate may be accomplished by modifying $\Delta t_k$. The k-th varying increment at sample n, $dt_k(n)$, may also be identical for all k values. Adjusting sampling time, changing sampling rate, and compensating for phase skews between the ADCs may be accomplished by computing and/or modifying $t_k(0)$, $\Delta t_k$ and $dt_k(n)$ in the interpolators.

Figure 5:
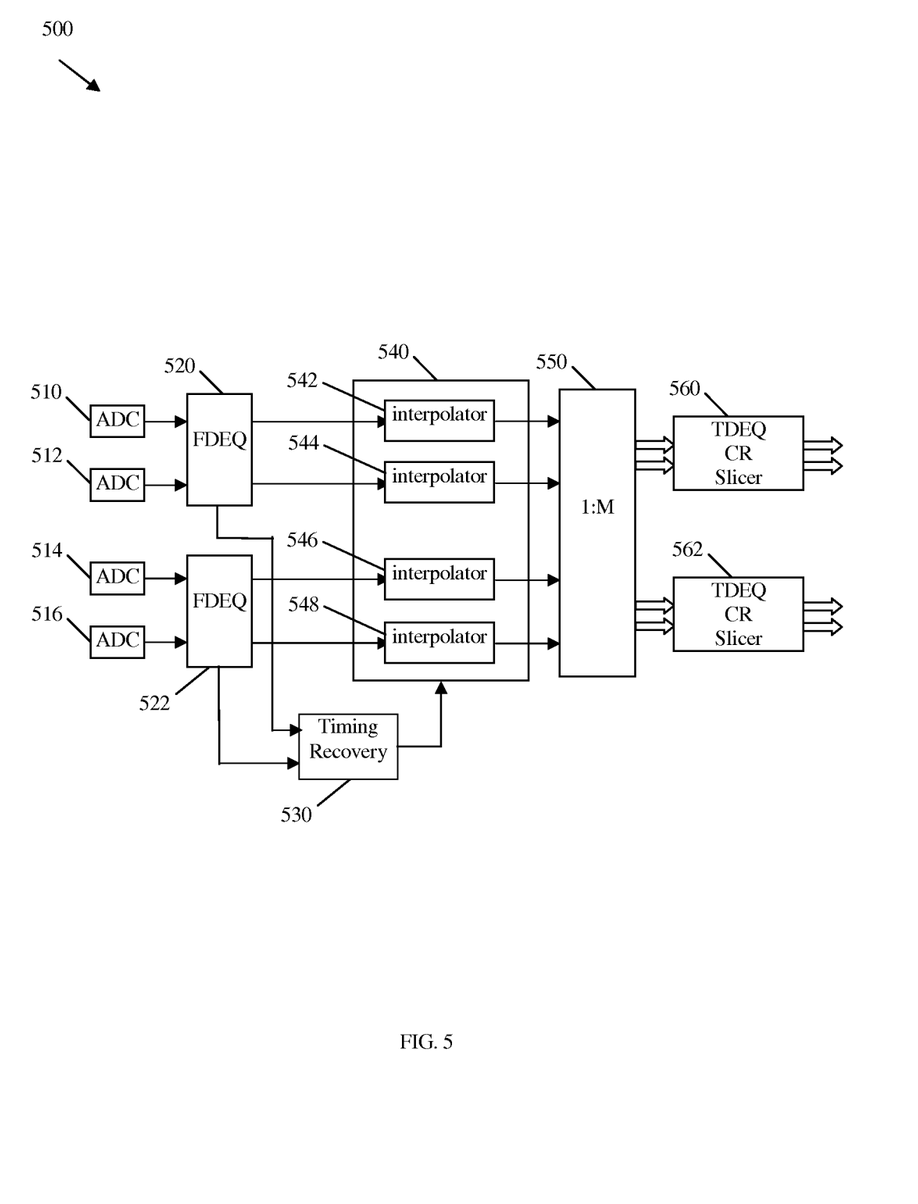
FIG. 5 is a schematic diagram of an embodiment of an optical receiver.

FIG. 5 illustrates an embodiment of a typical optical receiver 500 that comprises time-domain interpolators. The optical receiver 500 may comprise a plurality of ADCs 510, 512, 514, 516, two FDEQs 520 and 522, a demultiplexer 550, and two TDEQs 560 and 562. The components of the optical receiver 500 may be configured substantially similar to the corresponding components of the optical receiver 100. Additionally, the optical receiver 500 may comprise a timing recovery block 530 and a plurality of time-domain interpolators 540. The components of the optical receiver 500 may be arranged as shown in FIG. 5. The timing recovery block 530 may be configured to implement a clock recovery method, such as the hybrid clock recovery scheme 300 or the digital clock recovery scheme 400. The time-domain interpolators 540 may be positioned between the FDEQs 520 and 522 and the demultiplexer 550 and may comprise the time-domain interpolators 542, 544, 546, 548. The FDEQs 520 and 522 may send a plurality of parameters associated with clock recovery to the timing recovery block 530. The timing recovery block 530 may then send a plurality of parameters associated with clock recovery to the time-domain interpolators 540. The optical receiver 500 may be implemented in a digital clock recovery scheme such as disclosed in M. Kuschnerov et. al, "Digital Timing Recovery for Coherent Fiber Optic Systems", OFC/NFOEC 2008, which is incorporated herein by reference.

Placing the time-domain interpolators 540 at the output of the FDEQs 520 and 522 may provide samples that have been compensated for substantially large and stable channel dispersion. However, the filtering effect on the misalignments at the FDEQs 520 and 522 may significantly complicate the computations required to compensate the sampling phase misalignments between the ADCs 510, 512, 514, 516. Further, when a product is designed to jointly support different data rate applications, a different sized FFT block and a resampling block may be required for each data rate, and thus additional hardware resources.

Figure 6:
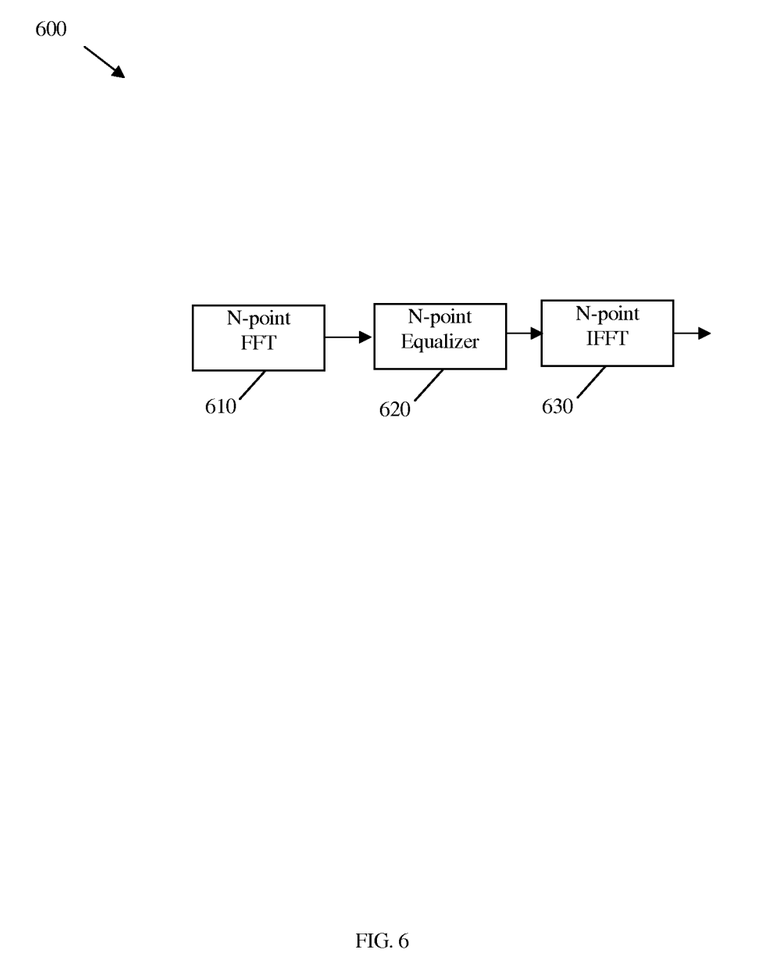
FIG. 6 is a schematic diagram of a frequency-domain equalizer (FDEQ).

FIG. 6 illustrates an embodiment of a typical FDEQ 600, which may be used in the optical receiver 500. For instance, the FDEQ 600 may correspond to the FDEQs 520 and 522. The FDEQ 600 may comprise an FFT block 610, an equalizer 620, and an Inverse Fast Fourier Transform (IFFT) bock 630, which may be arranged as shown in FIG. 6. The FFT block 610 may implement an algorithm to compute a discrete Fourier transform (DFT), and the IFFT block 630 may implement a corresponding inverse DFT. The FFT 610 block and the IFFT 630 block may perform computations, such as butterfly operations, that implement a plurality of Fourier transforms. The number of computations or operations implemented by the FFT block 610, and similarly the equalizer 620 and the IFFT block 630, may be characterized by a number of points, N, associated with the FFT block 610 and then IFFT block 630, also referred to herein as the size of the FFT block 610 or the IFFT block 630. The larger the size of the FFT block 610, the more computational and hardware resources the FFT block 610 may need.

Figure 7:
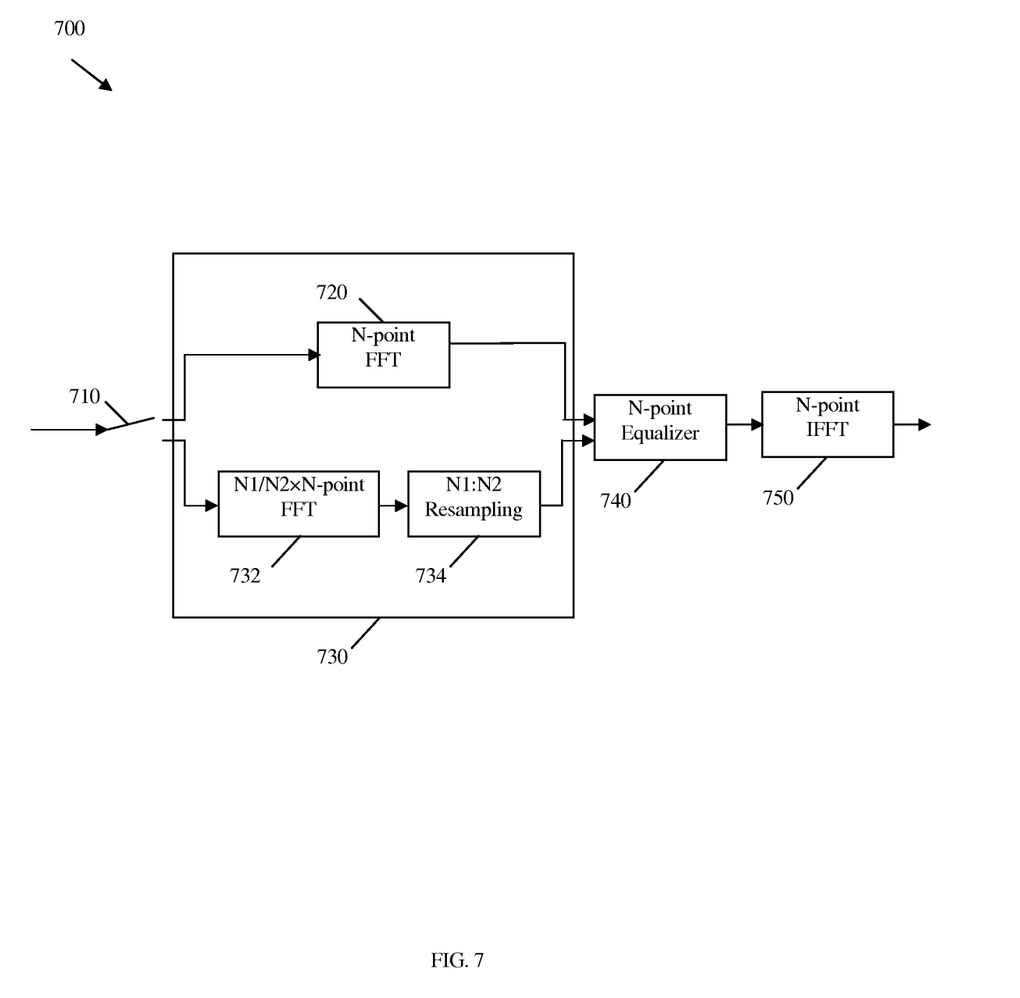
FIG. 7 is a schematic diagram of another embodiment of a FDEQ.

FIG. 7 illustrates an embodiment of a FDEQ 700 that may comprise a sampling rate change component 730. The sampling rate change component 730 may be configured to support applications at two different data rates $R_1$ and $R_2$, where $R_1$ and $R_2$ are proportional to N, $N_1/N_2*N$ respectively. The FDEQ 700 may comprise a switch 710, a sampling rate change component 730, an equalizer 740, and an IFFT block 750. The sampling rate change component 730 may comprise a first FFT block 720, a second FFT block 732, and a resampling bock 734. The components of the FDEQ 700 may be arranged as shown in FIG. 7. The first FFT block 720, the second FFT block 732, the equalizer 740, and the IFFT block 750 may be configured similar to the corresponding components of the FDEQ 600. However, the first FFT block 720 may have a size of N points and the second FFT block 732 may have a size of $(N_1/N_2) \times N$ points. The equalizer 740 and the IFFT block 750 may each have a size of N points. The sampling rate component 730 may be configured to support the data rates $R_1$ and $R_2$. The switch 710 may route the received data either to the first FFT block 720 or to the second FFT block 732, depending on whether the data rate of the input samples is $R_1$ or $R_2$, respectively.

Figure 8:
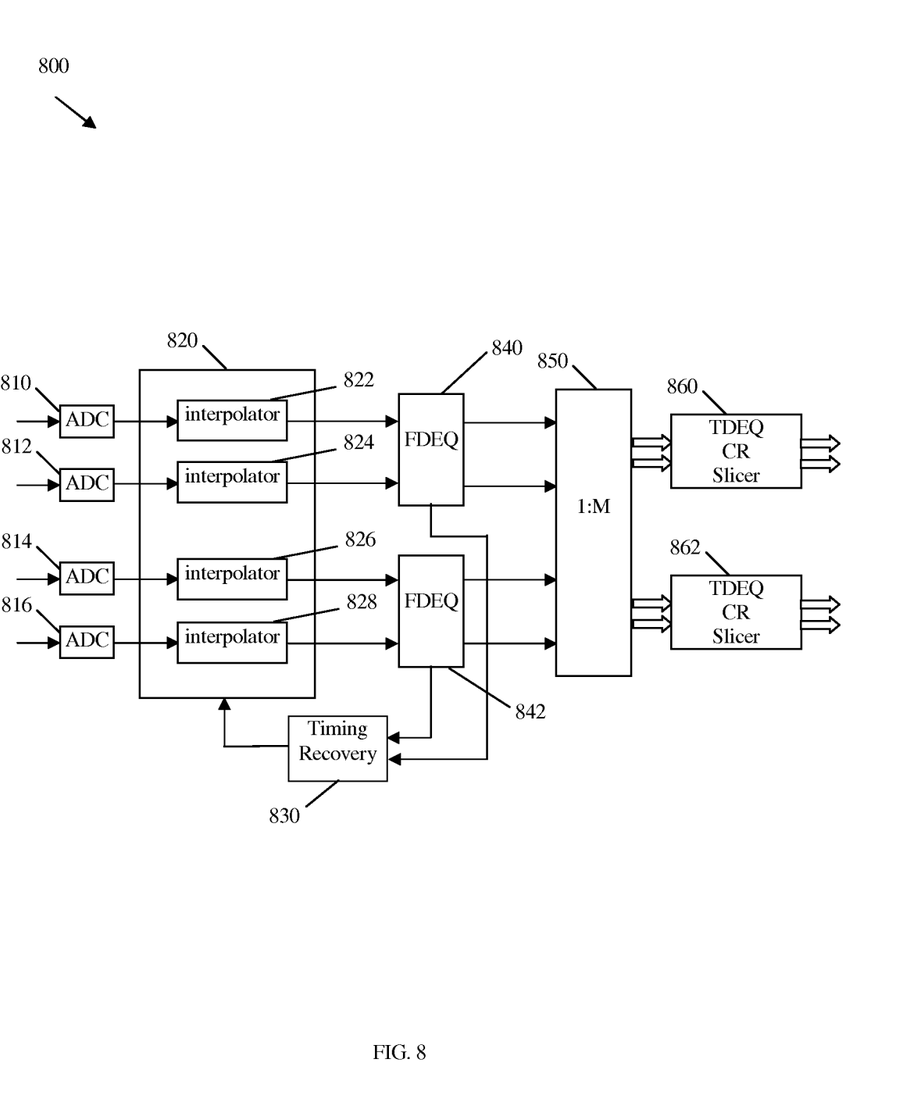
FIG. 8 is a schematic diagram of another optical receiver.

FIG. 8 illustrates another embodiment of an optical receiver 800 that may compensate for some of the disadvantages of the optical receiver 500. The optical receiver 800 may comprise a plurality of ADCs 810, 812, 814, 816, a time-domain interpolation component 820, a timing recovery component 830, two FDEQs 840 and 842, a demultiplexer 850, and two TDEQs 860 and 862. The components of the optical receiver 800 may be arranged as shown in FIG. 8. The ADCs 810, 812, 814, 816, the FDEQs 840 and 842, the demultiplexer 850, and the TDEQs 860 and 862 may be configured similarly to the corresponding components of the optical receiver 100 or the topical receiver 500. The time-domain interpolation component 820 may be positioned between the ADCs 810, 812, 814, 816 and the FDEQs 840 and 842. The time-domain interpolation component 820 may comprise a plurality of time-domain interpolators 822, 824, 826, 828. The FDEQs 840 and 842 may be configured to send in turn a plurality of parameters associated with clock recovery to the timing recovery block 830, which may be configured to send in turn a plurality of parameters associated with clock recovery to the time-domain interpolator component 820.

Placing the time-domain interpolators 822, 824, 826, 828 directly after the ADCs 110, 112, 114, 116 may improve the numerical accuracy of the clock recovery result since the sampling impairments may be in their original form at the inputs of interpolators 822, 824, 826, 828. As such, the sampling impairments at the inputs of interpolators 822, 824, 826, 828 may not be distorted by the filtering effects of the FDEQs 840 and 842. Performing sampling rate adaptation at the output of the ADCs 810, 812, 814, 816 may have the advantage of supporting communication applications with multiple data rates using same-sized FFTs, e.g., without the need to introduce additional FFTs and resampling blocks. Thus, the computational and hardware resources needed in the optical receiver 800 as well as overall cost may be reduced.

Figure 9:
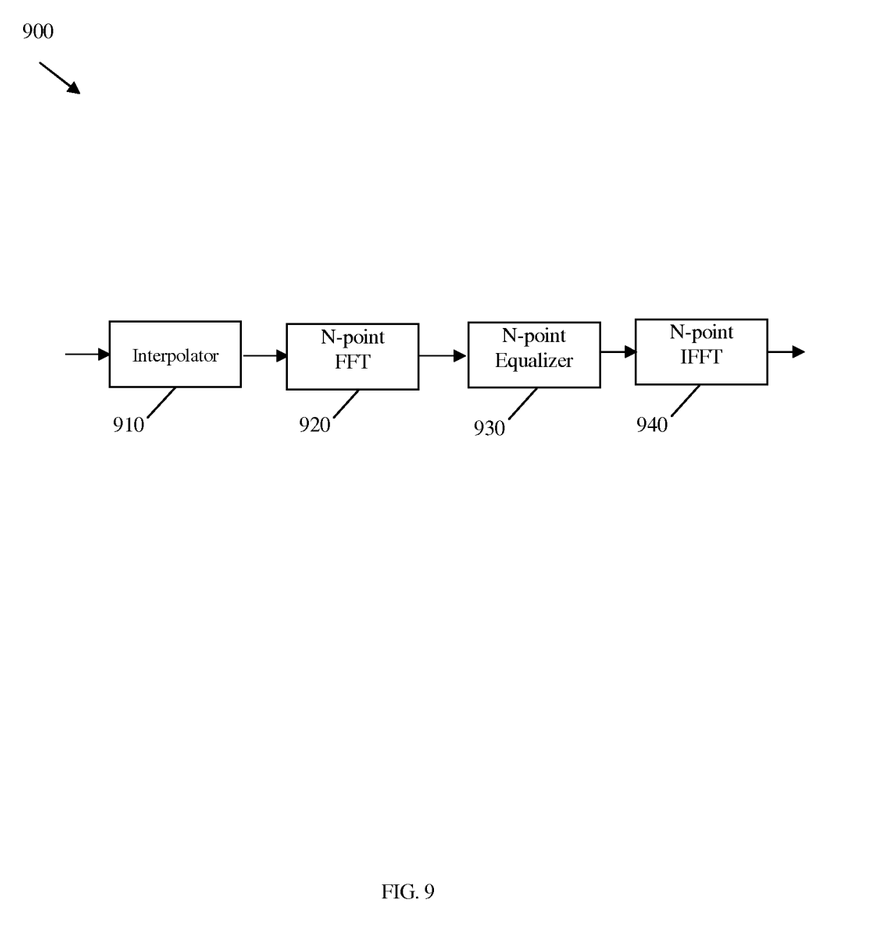
FIG. 9 is a schematic diagram of an embodiment of an interpolator and a FDEQ.

FIG. 9 illustrates an embodiment of an interpolator and FDEQ 900 that may comprise a sampling rate change component. The sampling rate change component in the interpolator and FDEQ 900 may support applications at two different data rates, e.g., for a single commercial product. The interpolator and FDEQ 900 may comprise a time-domain interpolator 910, a first N-point FFT block 920, an N-point equalizer 930, and a second N-point FFT block 940 may be parts of a FDEQ coupled directly to the interpolator 910. The first N-point FFT block 920, N-point equalizer 930, and second N-point FFT block 940. The interpolator and FDEQ 900 may be configured to support a plurality of data rates without requiring additional FFT blocks and resampling blocks, e.g., in the FDEQ. The time-domain interpolator 910 may perform sampling time adjustment, sampling rate change, ADC phase skew compensation, or combinations thereof. Controlling the sampling rates may be accomplished by modifying the value of $\Delta t_k$ in equation (1), as described above. As such, a variety of data rates may share the same the same first N-point FFT block 920 by determining the values of $t_k(n)$, $\Delta t_k$ and $dt_k$ in Equation (1) as described above.

Figure 10:
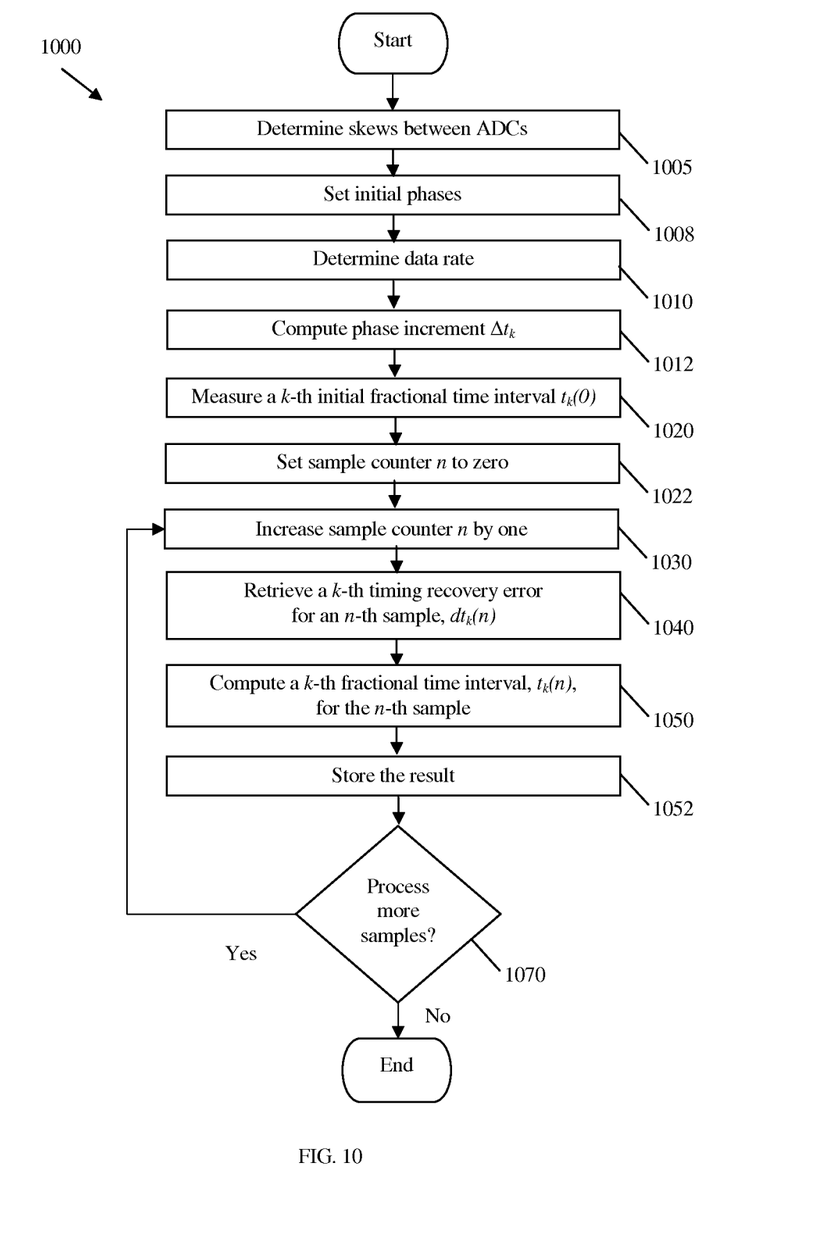
FIG. 10 is a flowchart of an embodiment of time-domain interpolation method.

FIG. 10 illustrates a flowchart of an embodiment of a time-domain interpolation method 1000 that may be implemented in an optical communication receiver, such as the optical communication receiver 800. For instance, the method 1000 may be implemented at the k-th time-domain interpolator, where k=1, 2, 3, or . . . N, and N indicates the total number of time-domain interpolators. The method 1000 may begin at block 1005, where skews between ADCs may be first determined. At block 1008, initial phases $t_1(0), \ldots, t_N(0)$ are set correspondingly to compensate the ADC skews. Then at block 1010, sampling rate for a selected application may be determined. At block 1012, a phase increment $\Delta t_k$ may be computed. The computed phase increment $\Delta t_k$ may correspond to the k-th nominal phase increment per output sample. At block 1020, a k-th initial fractional time interval, also referred to as initial phase, $t_k(0)$, may be measured and stored. The stored k-th initial phase $t_k(0)$ may be used for the k-th ADC phase skew compensation. At block 1022, a sample counter n may be set to about zero. At block 1030, the sample counter n may be increased by about one.

At block 1040, a k-th timing recovery error for an n-th sample, $dt_k(n)$, may be retrieved. For instance, $dt_k(n)$ may be received from a FDEQ block. The value of $dt_k(n)$ may be identical for all the ADCs in the optical communication receiver. At block 1050, a k-th fractional time interval of the n-th sample, $t_k(n)$, may be computed based on $dt_k(n)$ and a second phase increment, $\Delta t_k(n)$, associated with the data rate, e.g., using equation (1). The value $t_k(n)$ may be computed from a stored k-th fractional time interval of the previous sample, e.g., $t_k(n-1)$. For instance, the values of $t_k(n)$ may be computed according to equation (1) above. At block 1052, the result of the computation may be stored. At block 1070, the method 1000 may determine whether to process more samples, e.g., if there are more samples to process. If the condition at block 1070 is met, then the method 1000 may return to block 1030. Otherwise, the method 1000 may end.

Figure 11:
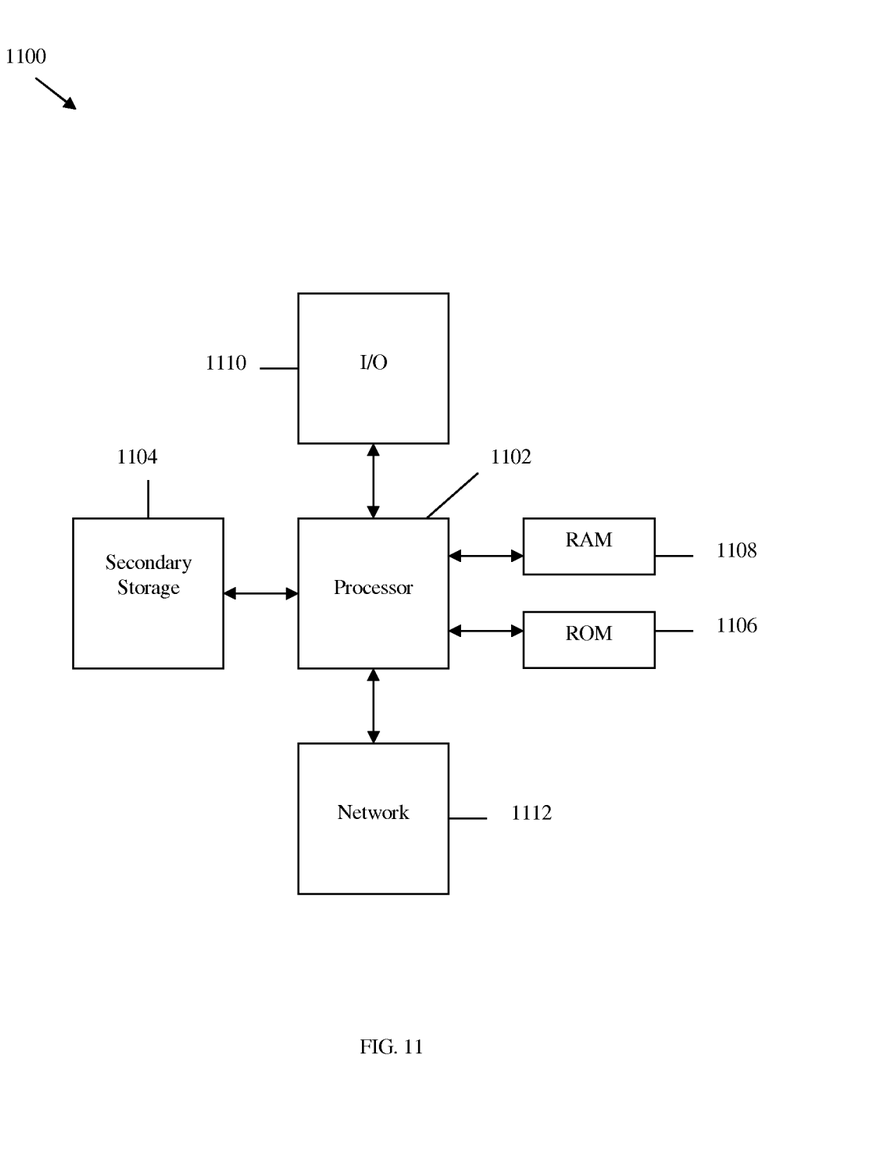
FIG. 11 is a schematic diagram of an embodiment of a general-purpose computer system.

The network components described above may be implemented on any general-purpose network component, such as a computer or network component with sufficient processing power, memory resources, and network throughput capability to handle the necessary workload placed upon it. FIG. 11 illustrates a typical, general-purpose network component 900 suitable for implementing one or more embodiments of the components disclosed herein. The network component 1100 includes a processor 1102 (which may be referred to as a central processor unit or CPU) that is in communication with memory devices including secondary storage 1104, read only memory (ROM) 1106, random access memory (RAM) 1108, input/output (I/O) devices 1110, and network connectivity devices 1112. The processor 1102 may be implemented as one or more CPU chips, or may be part of one or more ASICs.

The secondary storage 1104 is typically comprised of one or more disk drives or tape drives and is used for non-volatile storage of data and as an overflow data storage device if RAM 1108 is not large enough to hold all working data. Secondary storage 1104 may be used to store programs that are loaded into RAM 1108 when such programs are selected for execution. The ROM 1106 is used to store instructions and perhaps data that are read during program execution. ROM 1106 is a non-volatile memory device that typically has a small memory capacity relative to the larger memory capacity of secondary storage 1104. The RAM 1108 is used to store volatile data and perhaps to store instructions. Access to both ROM 1106 and RAM 1108 is typically faster than to secondary storage 1104.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 5, 4, etc.; greater than 0.10 includes 0.11, 0.12, 0.15, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k\times(R_u-R_l)$, wherein k is a variable ranging from 1 percent to 100 percent with a 1 percent increment, i.e., k is 1 percent, 2 percent, 5 percent, 4 percent, 5 percent, . . . , 50 percent, 51 percent, 52 percent, . . . , 75 percent, 76 percent, 77 percent, 78 percent, 77 percent, or 100 percent. Moreover, any numerical range defined by two R numbers as defined above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method of updating a fractional time interval, comprising:
   retrieving a previously computed fractional time interval for a previous time sample from a data store; and
   computing, by a processor, a time-domain interpolation based on an updated fractional time interval based on the previously computed fractional time interval, a nominal phase increment associated with a data rate, and a measured timing recovery error.

2. The method of claim 1, wherein the nominal phase increment is determined based on a sampling rate in a time-domain interpolator.

3. The method of claim 1, wherein the time-domain interpolator changes a sampling rate associated with a signal sample, adjusts a sampling time associated with the signal sample, and compensates the signal sample for a phase skew associated with an analog-to-digital converter (ADC).

4. The method of claim 3, wherein changing the sampling rate comprises computing a nominal phase increment, wherein adjusting the sampling time comprises computing a varying phase increment, and wherein compensating the signal sample for the phase skew associated with the ADC comprises computing an initial phase.

5. The method of claim 1, wherein the fractional time interval is computed based on the following equation:

$$t_k(n)=[t_k(n-1)+\Delta t_k+dt_k(n)] \bmod 1$$

where $t_k(n)$ is a fractional time interval for a sample n at a kth analog-to-digital converter (ADC), $t_k(n-1)$ is a fractional time interval for a sample n−1, $\Delta t_k$ is the nominal phase increment, and $dt_k(n)$ is a measured timing recovery error for the sample n.

6. The method of claim 5, wherein mod 1 is a modulus function.

7. The method of claim 5, wherein $t_k(0)$ is used to compensate for phase skew among the k ADCs.

8. An optical receiver comprising:
   a memory; and
   a processor coupled to the memory and configured to:
      retrieve from the memory a previously computed fractional time interval for a previous time sample from a data store; and
      compute a time-domain interpolation based on an updated fractional time interval based on the previously computed fractional time interval, a nominal phase increment associated with a data rate, and a measured timing recovery error.

9. The method of claim 8, wherein the nominal phase increment is determined based on a sampling rate in a time-domain interpolator.

10. The method of claim 8, wherein the time-domain interpolator changes a sampling rate associated with a signal sample, adjusts a sampling time associated with the signal sample, and compensates the signal sample for a phase skew associated with an analog-to-digital converter (ADC).

11. The method of claim 10, wherein changing the sampling rate comprises computing a nominal phase increment, wherein adjusting the sampling time comprises computing a varying phase increment, and wherein compensating the signal sample for the phase skew associated with the ADC comprises computing an initial phase.

12. The method of claim 8, wherein the fractional time interval is computed based on the following equation:

$$t_k(n)=[t_k(n-1)+\Delta t_k+dt_k(n)] \bmod 1$$

where $t_k(n)$ is a fractional time interval for a sample n at a kth analog-to-digital converter (ADC), $t_k(n-1)$ is a fractional time interval for a sample n−1, $\Delta t_k$ is the nominal phase increment, and $dt_k(n)$ is a measured timing recovery error for the sample n.

13. The method of claim 12, wherein mod 1 is a modulus function.

14. The method of claim 12, wherein $t_k(0)$ is used to compensate for phase skew among the k ADCs.

15. In an optical receiver, a computer program product comprising computer executable instructions stored on a non-transitory medium that when executed by a processor cause the processor to perform the following:
   retrieve from the medium a previously computed fractional time interval for a previous time sample from a data store; and
   compute a time-domain interpolation based on an updated fractional time interval based on the previously computed fractional time interval, a nominal phase increment associated with a data rate, and a measured timing recovery error.

16. The method of claim 15, wherein the nominal phase increment is determined based on a sampling rate in a time-domain interpolator.

17. The method of claim 15, wherein the time-domain interpolator changes a sampling rate associated with a signal sample, adjusts a sampling time associated with the signal sample, and compensates the signal sample for a phase skew associated with an analog-to-digital converter (ADC).

18. The method of claim 17, wherein changing the sampling rate comprises computing a nominal phase increment, wherein adjusting the sampling time comprises computing a varying phase increment, and wherein compensating the signal sample for the phase skew associated with the ADC comprises computing an initial phase.

19. The method of claim 15, wherein the fractional time interval is computed based on the following equation:

$$t_k(n) = [t_k(n-1) + \Delta t_k + dt_k(n)] \bmod 1$$

where $t_k(n)$ is a fractional time interval for a sample n at a kth analog-to-digital converter (ADC), $t_k(n-1)$ is a fractional time interval for a sample n−1, $\Delta t_k$ is the nominal phase increment, and $dt_k(n)$ is a measured timing recovery error for the sample n.

20. The method of claim 19, wherein $t_k(0)$ is used to compensate for phase skew among the k ADCs.

* * * * *